(12) United States Patent
Komatsu et al.

(10) Patent No.: US 8,709,853 B2
(45) Date of Patent: Apr. 29, 2014

(54) METHOD OF MANUFACTURING CRYSTALLINE SILICON SOLAR CELLS WITH IMPROVED SURFACE PASSIVATION

(75) Inventors: Yuji Komatsu, Alkmaar (NL); Lambert Johan Geerligs, Alkmaar (NL); Valentin Dan Mihailetchi, Groningen (NL)

(73) Assignee: ECN Energieonderzoek Centrum Nederland (NL)

( * ) Notice: Subject to any disclaimer, the term of this patent is extended or adjusted under 35 U.S.C. 154(b) by 642 days.

(21) Appl. No.: 12/442,935

(22) PCT Filed: Sep. 20, 2007

(86) PCT No.: PCT/NL2007/050459
§ 371 (c)(1),
(2), (4) Date: Feb. 26, 2010

(87) PCT Pub. No.: WO2008/039067
PCT Pub. Date: Apr. 3, 2008

(65) Prior Publication Data
US 2010/0154883 A1   Jun. 24, 2010

(30) Foreign Application Priority Data

Sep. 25, 2006  (NL) ..................................... 2000248

(51) Int. Cl.
*H01L 31/18* (2006.01)
*H01L 21/469* (2006.01)

(52) U.S. Cl.
USPC ......... 438/71; 438/72; 438/787; 257/E21.487

(58) Field of Classification Search
USPC ............................. 438/72, 787; 257/E21.487
See application file for complete search history.

(56) References Cited

U.S. PATENT DOCUMENTS 4,927,770 A * 5/1990 Swanson .......................... 438/83
4,994,879 A * 2/1991 Hayashi ........................ 257/432
(Continued)

FOREIGN PATENT DOCUMENTS

| EP | 0729189 | 8/1996 |
| EP | 0875945 | 11/1998 |
| JP | 4-226084 | 8/1992 |
| JP | 10-11312665 | 9/1999 |
| WO | WO2004047184 | 6/2004 |

OTHER PUBLICATIONS

Imai et al., Formation and Electrical Characteristics of Silicon Dioxide Layers by use of Nitric Acid Oxidation Method, Institue of Physics, vol. 55, No. 3, 2005, pp. 305-313.*

(Continued)

*Primary Examiner* — David Vu
*Assistant Examiner* — Earl Taylor
(74) *Attorney, Agent, or Firm* — Meyer IP Law Group

(57) ABSTRACT

The present invention provides a method of manufacturing a crystalline silicon solar cell, comprising: —providing a crystalline silicon substrate having a front side and a back side; —forming a thin silicon oxide film on at least one of the front and the back side by soaking the crystalline silicon substrate in a chemical solution; —forming a dielectric coating film on the thin silicon oxide film on at least one of the front and the back side. The thin silicon oxide film may be formed with a thickness of 0.5-10 nm. By forming a oxide layer using a chemical solution, it is possible to form a thin oxide film for surface passivation wherein the relatively low temperature avoids deterioration of the semiconductor layers.

17 Claims, 3 Drawing Sheets

(56) References Cited

U.S. PATENT DOCUMENTS

| | | | |
|---|---|---|---|
| 5,288,338 | A | 2/1994 | Morikawa |
| 6,060,732 | A * | 5/2000 | Murakami et al. ............ 257/215 |
| 6,080,683 | A * | 6/2000 | Faur et al. .................... 438/770 |
| 6,287,699 | B1 * | 9/2001 | Yasuda et al. ................. 428/446 |
| 6,504,091 | B2 * | 1/2003 | Hisamatsu et al. ........... 136/262 |
| 6,593,077 | B2 * | 7/2003 | Faur et al. .................... 438/770 |
| 6,596,186 | B2 * | 7/2003 | Yasuda et al. .................. 216/41 |
| 7,435,361 | B2 * | 10/2008 | Carroll et al. ................. 252/514 |
| 7,462,304 | B2 * | 12/2008 | Wang et al. ................... 252/514 |
| 7,556,748 | B2 * | 7/2009 | Wang et al. ................... 252/514 |
| 2002/0028322 | A1 * | 3/2002 | Yasuda et al. ................. 428/210 |
| 2003/0027433 | A1 * | 2/2003 | Faur et al. .................... 438/770 |
| 2005/0221613 | A1 * | 10/2005 | Ozaki et al. .................. 438/666 |
| 2006/0231800 | A1 * | 10/2006 | Wang et al. ................... 252/500 |
| 2006/0231801 | A1 * | 10/2006 | Carroll et al. ................. 252/500 |
| 2006/0231804 | A1 * | 10/2006 | Wang et al. ................... 252/500 |
| 2007/0169808 | A1 * | 7/2007 | Kherani et al. ............... 136/258 |
| 2008/0283120 | A1 * | 11/2008 | Komatsu et al. .............. 136/258 |
| 2009/0038682 | A1 * | 2/2009 | Komatsu et al. .............. 136/258 |
| 2010/0154883 | A1 * | 6/2010 | Komatsu et al. .............. 136/256 |

OTHER PUBLICATIONS

Asuha et al., Formation of 10-30 nm SiO2/Si structure with a uniform thickness at ~120° C. by nitric acid oxidation method, Surface Science, 600, 2006, pp. 2523-2527.*

Asuha et al., Ultrathin silicon dioxide layers with low leakage current density formed by chemical oxidation of Si, Applied Physics Letters, vol. 81, No. 18, 2002, pp. 3410-3412.*

Asuha et al., Effects of postmetallization annealing on ultrathin SiO2 layer properties, Applied Physics Letters, vol. 80, No. 22, 2002, pp. 4175-4177.*

Schmidt et al., Surface passivation of silicon solar cells using plasma-enhanced chemical-vapour-deposited SiN films and thin thermal SiO2/plasma SiN stacks, Semiconductor Science and Technology, 16, 2001, pp. 164-170.*

Aberle, Crystalline silicon solar cells: advanced surface passivation and analysis, Centre for Photovoltaic Engineering, University of New South Wales, 1999, 2 pages.

Wilson, et al., Handbook of Multilevel Metallization for Integrated Circuits: Materials, Technology, and Applications, 1993, 2 pages.

* cited by examiner

METHOD OF MANUFACTURING CRYSTALLINE SILICON SOLAR CELLS WITH IMPROVED SURFACE PASSIVATION

This application is a national stage application that claims priority under 35 U.S.C. 371 to Patent Cooperation Treaty Application No. PCT/NL2007/050459, entitled "Method of Manufacturing Crystalline Silicon Solar Cells With Improved Surface Passivation," inventors Komatsu, Yuji et al., filed Sep. 20, 2007, and which has been published as Publication No. WO2008/039067, which claims priority of The Netherlands patent application No. 2000248 filed Sep. 25, 2006, both of which applications are herein incorporated by reference.

FIELD OF THE INVENTION

The present invention relates to the manufacture of solar cells. It more particularly relates to a method of manufacturing crystalline silicon solar cells comprising a silicon oxide passivation layer and a dielectric coating.

BACKGROUND OF THE INVENTION

Solar cells made of single- or multi-crystalline silicon are usually provided with a dielectric coating on a front side (i.e. the light incident side) in order to lead the incident light effectively to the semiconductor layer. Such a dielectric coating is often referred to as anti-reflection coating (ARC) film.

The performance of a solar cell is largely influenced by the degree of suppression of recombination of the photo-generated carriers at the interface between the semiconductor layer and the ARC film. Suppression of recombination of the photo-generated carriers is normally realized using what is called surface passivation.

As an ARC film for multi-crystalline silicon solar cell, a silicon nitride film is often used because it has a good anti-reflecting effect and a sufficient surface passivation effect can be expected. It is also used for single crystalline silicon solar cells for the same reason. Alternatively, a thermal oxide film is used in which case more effective surface passivation can be expected than by silicon nitride.

Normally, a thermal oxide film with sufficient surface passivation requires a high temperature process (approximately 1000° C.), which will deteriorate the efficiency of the solar cells. Additionally, the refraction index of thermal oxide film (1.45) is too low for the proper ARC for silicon solar cells.

In crystalline silicon solar cells, a back surface field (BSF) layer is usually formed by coating and alloying by heat treatment of an aluminium paste on the back side. The thickness of the crystalline silicon solar cell will most certainly decrease in the future because of a shortage of the silicon feedstock. This will lead to a worse effectiveness of the BSF layer since it will bend the thin substrate and will also lower the internal reflection at the back side. Nowadays, in order to replace the BSF layer, a dielectric film, such as a silicon nitride film, or a thermal silicon oxide film is adopted with a partly removed area for back side electrodes. As mentioned above, a silicon nitride film can provide a good passivation effect and a thermal oxide film can be even better. Additionally, these dielectric films can enhance the internal reflection at the back side of the solar cells as compared to aluminium BSF.

Requirements for a dielectric film deposited on a semiconductor substrate for a crystalline silicon solar cell are:
  formable at relatively low temperature
  high passivation effect
  anti-reflection effect when formed at the front side
  anti-reflection effect or enhancement of the internal reflection when formed at the back side.

For such a dielectric film, when used for optimal anti-reflection effect, the refractive index should be lower than that of silicon (3.3) and higher than that of packaging resin or cover glass (1.4~1.6). Silicon nitride film can satisfy most of the conditions above, but its passivation effect is inferior to that of a thermal oxide film. A thin thermal oxide may be inserted between the silicon and the silicon nitride, to satisfy the conditions described above, without reducing either optical effect of anti-reflecting at the front or enhancing internal reflection at the back in spite of low refractive index (1.45) of thermal oxide. A thermal oxide film with sufficient surface passivation requires a high temperature process (approximately 1000° C.), which will deteriorate the efficiency of the solar cells. However, forming a sufficiently thin (<70 nm) thermal oxide with a good surface passivation and under good control is very difficult. One possibility is to provide a thermal oxide film on the silicon substrate and then to thin the thermal oxide film by way of etching, but in that case it is impossible to create a thermal oxide film with a uniform thickness. Even though thermal oxidation at lower temperatures (around 800° C.) can form a thin oxide film to some extent, its surface passivation effect is normally low and sometimes even inferior to that of a silicon nitride film.

SUMMARY OF THE INVENTION

It is an object of the present invention to provide a method of manufacturing a crystalline silicon solar cell having a silicon substrate and a two layered structure for the surface passivation, wherein the solar cell efficiency is improved.

The object is achieved by providing a method of manufacturing a crystalline silicon solar cell, comprising:
  providing a crystalline silicon substrate having a front side and a back side;
  forming a thin silicon oxide film on at least one of the front and the back side by soaking the crystalline silicon substrate in a chemical solution;
  forming a dielectric coating film on the thin silicon oxide film on at least one of the front and the back side.

In the method according to an embodiment, a dielectric coating film and a thin silicon oxide film is manufactured at the front and/or at the back side of the substrate. The thin silicon oxide film is formed by soaking the crystalline silicon substrate in a chemical solution. The soaking process is well-controllable and is performed at a relative low temperature (<150° C.). So the forming of this layer will not affect the semiconductor properties of the (already doped) substrate. Furthermore, the passivation effect is comparable or even better than that of a thermal oxide. Also, by using a chemical solution for oxidation, a very thin uniform silicon oxide layer can be formed.

It is noted that the crystalline silicon substrate which is provided may already be partly processed. In addition, a silicon substrate may be provided that is partly protected from being oxidised, for example by a silicon nitride or other film which partly covers the surface.

Preferably, the dielectric coating film will be acting as anti-reflection coating when on the front side, and it will be acting as anti-reflection or internal reflection coating when formed on the back side, depending on whether the solar module is bifacial or not, respectively.

In an embodiment the thin silicon oxide film is formed with a thickness of 0.5-10 nm. It is noted that on an unprotected silicon surface at room temperature a so-called "native oxide" film will grow. This very thin film (approx. 0.5 nm thick) does not have good passivation properties. Therefore, according to an embodiment, the native oxide film is removed after which a new silicon oxide film is grown by soaking the crystalline substrate in a chemical solution. The thin silicon oxide film will perform its passivation task and will be transparent for the incident light on the front side of the solar cell.

In an embodiment, the silicon oxide film is formed by treatment of the crystalline silicon substrate in the chemical solution at a temperature under 150° C. This low temperature will avoid a decreasing quality of the semiconductor properties. Preferably the temperature is about room temperature, so that temperature settings can be achieved very easily.

The chemical solution may comprise nitric acid, hydrogen peroxide, sulphuric acid, hydrochloric acid, ozone, acetic acid, boiling water, or ammonium hydride or a combination of these.

The thin oxide film may be formed by an electrochemically-enhanced reaction. This has the advantage of reducing the oxidation time and solution concentration.

In an embodiment, the dielectric coating film comprises hydrogen. The dielectric coating film may comprise for example silicon nitride including hydrogen, or amorphous silicon carbide including hydrogen.

In a further embodiment, after formation of the dielectric coating film, the method comprises annealing. The annealing temperature is preferably more than 50° C. higher than the deposition temperature of the dielectric coating film. This method allows hydrogen from said dielectric coating layer to be emitted and to penetrate the thin silicon oxide film reacting with the defect states present at the semiconductor surface or in the silicon oxide film, thus enhancing the passivation effect of crystalline silicon.

The dielectric coating film when acting as an anti-reflection coating film, preferably has a refraction index between 1.8-3.0, since it should be lower than that of silicon (3.3) and higher than that of packaging resin or cover glass (1.4~1.6).

In an aspect, the invention also relates to a solar cell manufactured by a method described above.

BRIEF DESCRIPTION OF THE DRAWINGS

Further advantages and characteristics of the present invention will become clear on the basis of a description of a number of embodiments, in which reference is made to the appended drawings, in which.

DETAILED DESCRIPTION OF EXEMPLARY EMBODIMENTS

In order to explain the benefits of the invention, below some examples are described of solar cells using known methods and using the method according to embodiment of the invention. Wafers selected for these practical examples consist of a n-type multi-crystalline silicon (Si) substrate with a resistivity of 0.3~1.5 Ohm-cm. The wafers were sliced out from a casted ingot which was previously cut to 12.5×12.5 cm$^2$. The wafers are divided in four groups, each group having 25 wafers. Hereafter, the groups are named as group A, group B, group C, and group D.

Figure 1:
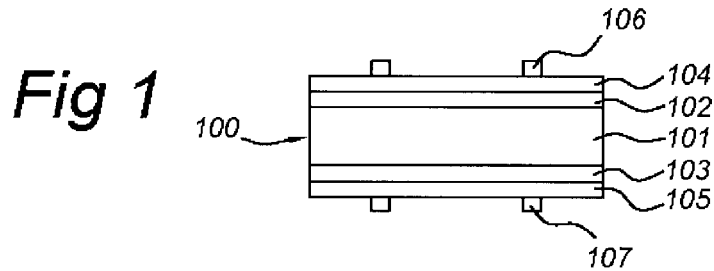
FIG. 1 shows an example of a practical formation of a solar cell according to the state of the art.
Figure 2:
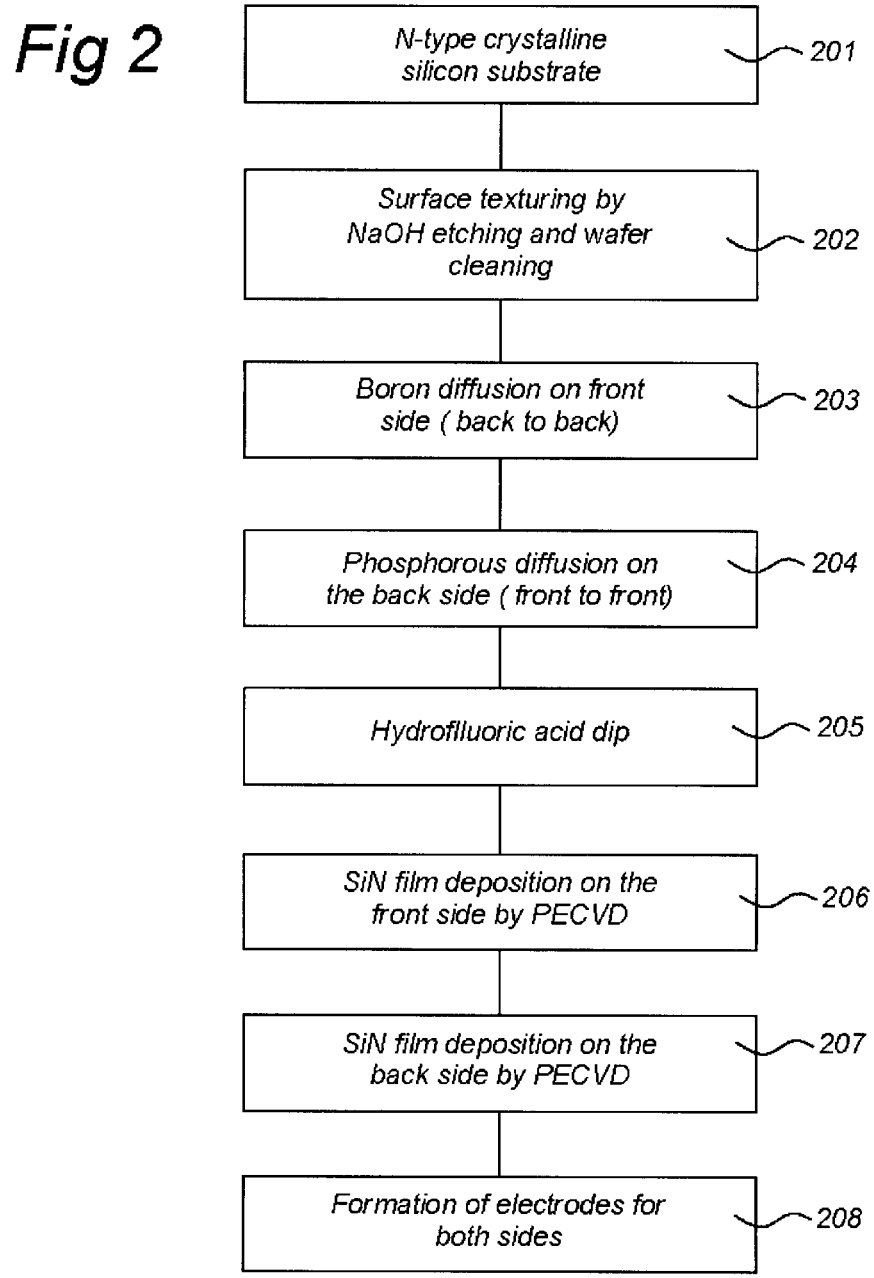
FIG. 2 shows a flow chart of a state of the art manufacturing process corresponding to the solar cell of FIG. 1.

Group A is the reference group of a conventional multi-crystalline silicon solar cell whose surface passivation is provided by the silicon nitride anti-reflection coating layer. The structure of the solar cells is shown in FIG. 1 and its fabrication process steps are shown in FIG. 2. The solar cell 100 comprises a silicon substrate 101 having a phosphorous diffused back layer 103 and a boron diffused front layer 102. On both sides of the substrate 101, a silicon nitride film is formed; see back side silicon nitride film 105 and front side silicon nitride film 104. At both sides electrodes 106, 107 are manufactured. The specific process conditions at each process step are shown in FIG. 2. In a first step 201a n-type silicon substrate is provided, by way of for example cutting a wafer from an ingot. Then in a step 202, a surface texturing is performed using a chemical solution of NaOH. Next, in a step 203, boron is diffused into the substrate at the front side, at a temperature of 900-950° C. This can be done using for example a back-to-back configuration wherein two substrates are placed with their back side pressed together. Then in a step 204 phosphorous is diffusion on the back side, at a temperature of 850-880° C. in a front-to-front configuration wherein two substrates are placed with their front side pressed together. Step 204 is followed by a step 205 in which the substrate is dipped in a hydrofluoric acid solution in order to remove the native oxide from the surface prior to the anti-reflection layer deposition. Then, silicon nitride (SiN) is deposited (in step 206) on the front side using plasma enhanced chemical vapour deposition (PECVD) at 300-500° C. with mixed gasses of SiH4/NH3/N2. In a following step 207, silicon nitride is also deposited on the back side using PECVD at 300-500° C. with mixed gasses of SiH4/NH3/N2. Finally at a step 208, a screen printing using mixed silver and aluminium pastes for the front side and a silver paste for the back side is performed as is known to the skilled person. After the screen printing a simultaneously firing (thermal annealing) of the front and back pastes at temperature between 750-950° C. is used.

Figure 3:
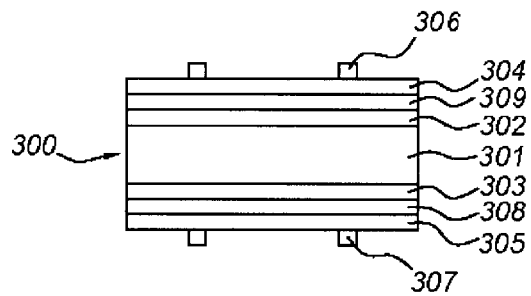
FIG. 3 shows an example of a practical formation of an embodiment of the solar cell.

FIG. 3 shows an example of a solar cell 300 according to the state of the art. The solar cell 300 is picked out of a reference group, referred to as Group B. The solar cell 300 comprises a silicon substrate 301 having a phosphorous diffused back layer 303 and boron diffused front layer 302. On both sides of the substrate 301, a silicon nitride film is formed; see back side silicon nitride film 305 and front side silicon nitride film 304. At both sides electrodes 306, 307 are manufactured. As compared to the solar cell of FIG. 1, in between the substrate 301 and the silicon nitride films 304, 305, in situ thermal oxide layers 308, 309 are formed.

Figure 4:
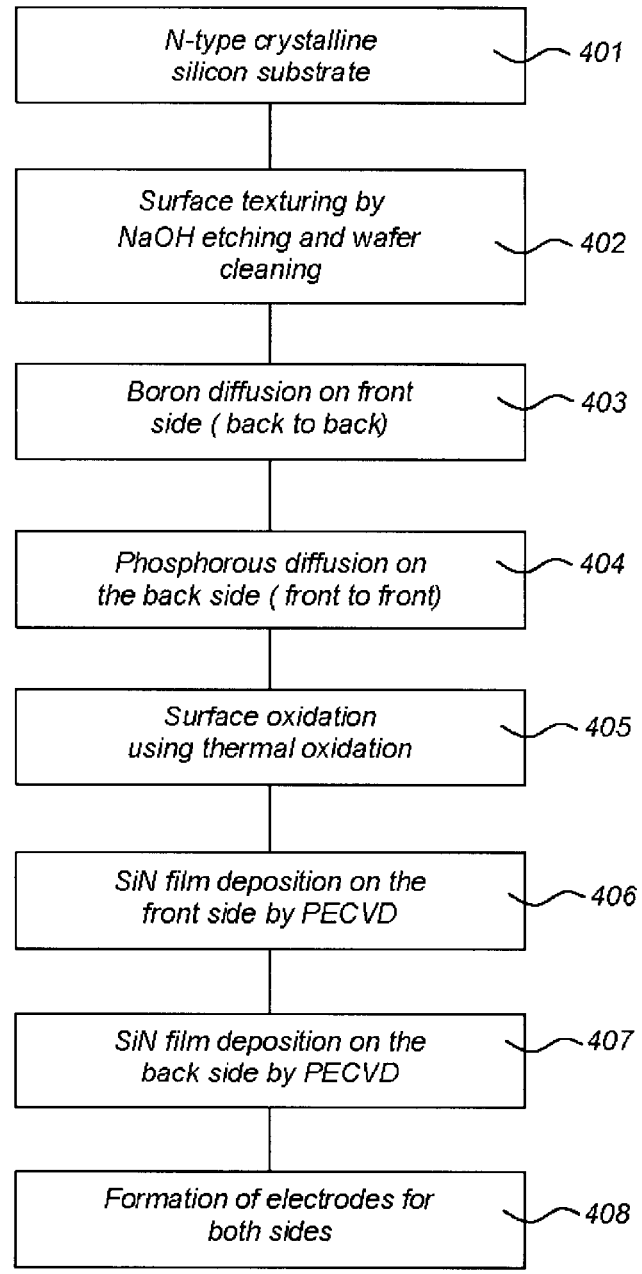
FIG. 4 shows a flow chart of a possible manufacturing process according to the state of the art.

FIG. 4 shows a flow chart of a manufacturing process of Group B. The specific process condition at each process step is as follows.

step 401: same as step 201.
step 402: same as step 202.
step 403: same as step 203.
step 404: same as step 204.
In step 405 a 20 nm silicon oxide film is grown using a thermal oxidation process by heating the substrate in a tube furnace at a temperature between 850-900° C.
step 406: same as step 206.
step 407: same as step 207.
step 408: same as step 208.

Figure 5:
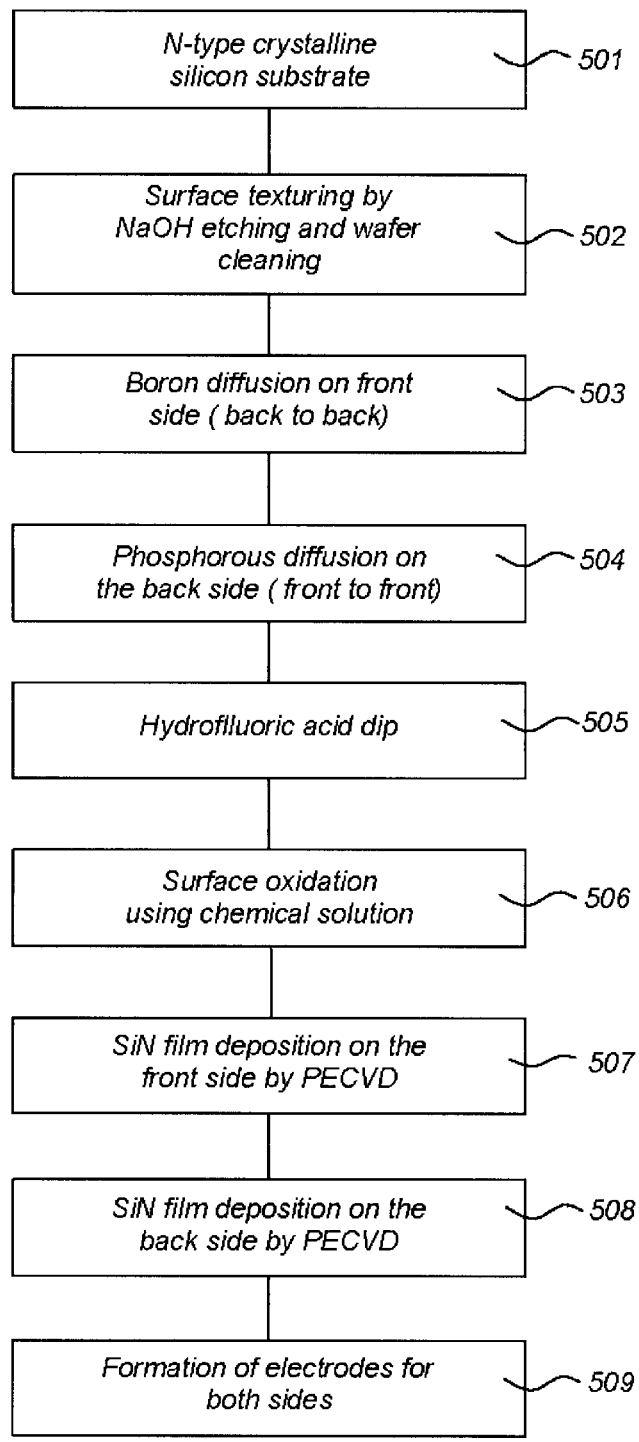
FIG. 5 shows a flow chart of a manufacturing process according to an embodiment of the invention.

Group C is the typical example of the invention. The fabrication process is the same as for the group B except that the silicon oxide films 308, 309 as shown in FIG. 3, are grown by soaking the wafers in a chemical solution of 68% nitric acid at room temperature for duration of 15 minutes. The thickness of the grown silicon oxide is 1.4 nm. FIG. 5 is a flow chart showing an example of the manufacturing process according to this embodiment. The specific process condition at each process step is as follows.

step 501: same as step 201.
step 502: same as step 202.
step 503: same as step 203.
step 504: same as step 204.
step 505: same as step 205.
In step 506, a silicon oxide film having a thickness of 1.4 nm is grown, by soaking the wafers in a chemical solution of 68% nitric acid at room temperature for duration of 15 minutes.
step 507: same as step 206.
step 508: same as step 207.
step 509: same as step 208.

In another embodiment of the invention, the fabrication process is the same as for the group B as shown in FIG. 3, except that the silicon oxide film 308, 309 is grown by soaking the wafers in a chemical solution of 68% nitric acid at a temperature of 120° C. for duration of 15 minutes. Solar cells resulting from this embodiment are referred to as Group D.

The solar cell properties are characterized under the condition of IEC 60904 as will be known to the skilled person. The averaged values of the solar cell parameters are shown in Table I for each of the above mentioned groups, wherein Jsc is the short circuit current, Voc is the open circuit voltage and FF is the Fill Factor.

TABLE I

The solar cell properties under the condition of IEC 60904

| Group | Passivation method of the Si surface | Jsc [mA/cm$^2$] | Voc [mV] | FF [%] | Efficiency [%] |
|---|---|---|---|---|---|
| A | SiN | 32.4 | 577 | 69.7 | 13.0 |
| B | Thermal oxide/SiN | 31.5 | 599 | 74.5 | 14.1 |
| C | Chemical oxide grown at room temperature/SiN | 31.7 | 620 | 75.6 | 14.8 |
| D | Chemical oxide grown at 120° C./SiN | 31.7 | 624 | 75.7 | 14.9 |

Comparing group A with groups C and D, one can see that the Voc and the power conversion efficiency are improved. Because of the thin silicon oxide intermediate layer between silicon nitride anti-reflection and semiconductor surface of groups C and D, the surface passivation of the semiconductor is strongly enhanced reducing the recombination probability of photo generated charges.

Comparing group B with groups C and D, one can see that the Voc and the power efficiency is further improved as a result of better passivation of the thin chemical oxide compared with the thermal oxide.

With adopting the invention described above, an improvement of 0.8~1.9 points in the power conversion efficiency is achieved as compared to the conventional solar cell process of n-type multi-crystalline substrate.

It will be understood that variants will occur to those skilled in the art on reading the above text. Those variants are deemed to lie within the scope of the invention as described in the appended claims.

The invention claimed is:

1. A method of manufacturing a crystalline silicon solar cell, comprising:
   providing a crystalline silicon solar cell substrate having a front side and a back side, wherein said crystalline silicon solar cell substrate is an n-type substrate;
   surface texturing said crystalline silicon solar cell substrate by chemically etching said crystalline silicon solar cell;
   after said surface texturing, creating a p-type layer in said front side of said crystalline silicon solar cell substrate;
   subsequently soaking the crystalline silicon solar cell substrate in a chemical solution for forming by oxidation of said crystalline silicon solar cell substrate a thin silicon oxide passivation film on at least one of said front and said back side; and
   forming a dielectric coating film on said thin silicon oxide passivation film on at least one of said front and said back side, wherein said thin silicon oxide passivation film is formed by treatment of said crystalline silicon substrate in said chemical solution at a temperature under 150° C.;
   wherein said thin silicon oxide passivation film is formed with a thickness of 0.5-10 nm.

2. The method according to claim 1, wherein said temperature is room temperature.

3. The method according to claim 1, wherein said chemical solution comprises at least one solution selected from the group consisting of:
   A. a solution containing nitric acid,
   B. a solution containing hydrogen peroxide,
   C. a solution containing sulphuric acid,
   D. a solution containing hydrochloric acid,
   E. a solution containing ozone,
   F. a solution containing acetic acid,
   G. a solution containing boiling water,
   H. a solution containing ammonium hydride.

4. The method according to claim 1, wherein said dielectric coating film comprises silicon nitride including hydrogen, or amorphous silicon carbide including hydrogen.

5. The method according to claim 1, wherein said dielectric coating film has a refraction index between 1.8-3.0.

6. The method according to claim 1, wherein said dielectric coating film, at least in use, functions as an anti-reflection coating film.

7. The method according to claim 1, wherein said dielectric coating film, at least in use, functions as an internal-reflection coating film.

8. A method of manufacturing a crystalline silicon solar cell, comprising:
   providing a crystalline silicon solar cell substrate having a front side and a back side;
   soaking the crystalline silicon solar cell substrate in a chemical solution for forming by oxidation, a thin silicon oxide passivation film on at least one of said front and said back side;
   forming a dielectric coating film on said thin silicon oxide passivation film on at least one of said front and said back side, wherein said thin silicon oxide passivation film is formed by treatment of said crystalline silicon substrate in said chemical solution at a temperature under 150° C.;
   wherein said thin silicon oxide passivation film is formed with a thickness of 0.5-10 nm;
   wherein said dielectric coating film comprises hydrogen; and
   annealing the crystalline silicon substrate after formation of said dielectric coating; and
   allowing hydrogen from said dielectric coating to be emitted and to penetrate the thin oxide passivation film.

9. The method according to claim 8, wherein said temperature is room temperature.

10. The method according to claim 8, wherein said chemical solution comprises at least one solution selected from the group consisting of:
  A. a solution containing nitric acid,
  B. a solution containing hydrogen peroxide,
  C. a solution containing sulphuric acid,
  D. a solution containing hydrochloric acid,
  E. a solution containing ozone,
  F. a solution containing acetic acid,
  G. a solution containing boiling water,
  H. a solution containing ammonium hydride.

11. The method according to claim 8, wherein said dielectric coating film comprises silicon nitride including hydrogen, or amorphous silicon carbide including hydrogen.

12. The method according to claim 8, wherein an annealing temperature is more than 50° C. higher than a deposition temperature of said dielectric coating film.

13. The method according to claim 8, wherein said dielectric coating film has a refraction index between 1.8-3.0.

14. The method according to claim 8, wherein said dielectric coating film, at least in use, functions as an anti-reflection coating film.

15. The method according to claim 8, wherein said dielectric coating film, at least in use, functions as an internal-reflection coating film.

16. The method according to claim 8, comprising surface texturing of the crystalline silicon solar cell substrate by chemically etching said crystalline silicon solar cell before said soaking said crystalline silicon solar cell substrate in said chemical solution.

17. The method according to claim 16, comprising after said surface texturing, creating a p-type layer in said front side of said crystalline silicon solar cell substrate, wherein said crystalline silicon solar cell substrate is a n-type substrate.

* * * * *